United States Patent
Chung (10) Patent No.: US 8,975,739 B2
(45) Date of Patent: Mar. 10, 2015

(54) PACKAGE STRUCTURE AND METHOD FOR MANUFACTURING THEREOF

(71) Applicant: Xintec Inc., Zhongli City, Taoyuan County (TW)

(72) Inventor: Ming-Chung Chung, Zhongli (TW)

(73) Assignee: Xintec Inc., Taoyuan (TW)

( * ) Notice: Subject to any disclaimer, the term of this patent is extended or adjusted under 35 U.S.C. 154(b) by 0 days.

(21) Appl. No.: 14/152,970

(22) Filed: Jan. 10, 2014

(65) Prior Publication Data

US 2014/0197536 A1 Jul. 17, 2014

Related U.S. Application Data

(60) Provisional application No. 61/751,381, filed on Jan. 11, 2013.

(51) Int. Cl.
| | | |
|---|---|---|
| *H01L 23/482* | (2006.01) | |
| *H01L 21/768* | (2006.01) | |
| *H01L 23/31* | (2006.01) | |
| *H01L 21/56* | (2006.01) | |

(52) U.S. Cl.
CPC ... *H01L 21/76885* (2013.01); *H01L 2924/0002* (2013.01); *H01L 23/3114* (2013.01); *H01L 23/3171* (2013.01); *H01L 21/561* (2013.01)
USPC .......... 257/692; 257/776; 257/777; 438/118; 438/126; 438/613; 438/666

(58) Field of Classification Search
CPC ............................... H01L 24/83; H01L 24/97
USPC .......... 438/118, 126, 613, 666; 257/692, 776, 257/777
See application file for complete search history.

(56) References Cited

U.S. PATENT DOCUMENTS

| | | | | |
|---|---|---|---|---|
| 6,316,830 | B1 * | 11/2001 | Lin ............................... | 257/737 |
| 6,753,208 | B1 * | 6/2004 | MacIntyre .................... | 438/118 |
| 2004/0014309 | A1 * | 1/2004 | Nakanishi ..................... | 438/614 |
| 2004/0169289 | A1 * | 9/2004 | Satou et al. ................... | 257/780 |
| 2007/0296067 | A1 * | 12/2007 | Lee et al. ...................... | 257/666 |
| 2008/0191343 | A1 * | 8/2008 | Liu ............................... | 257/723 |
| 2008/0230860 | A1 * | 9/2008 | Yen et al. ...................... | 257/433 |
| 2009/0014826 | A1 * | 1/2009 | Chien et al. ................... | 257/433 |
| 2009/0039455 | A1 * | 2/2009 | Chien et al. ................... | 257/433 |
| 2009/0289318 | A1 * | 11/2009 | Lin et al. ....................... | 257/433 |
| 2013/0049137 | A1 * | 2/2013 | Uno et al. ..................... | 257/401 |
| 2013/0130444 | A1 * | 5/2013 | Liu ............................... | 438/113 |
| 2014/0065769 | A1 * | 3/2014 | Huang et al. .................. | 438/113 |
| 2014/0319670 | A1 * | 10/2014 | Chien et al. ................... | 257/690 |

* cited by examiner

*Primary Examiner* — George Fourson, III
(74) *Attorney, Agent, or Firm* — Liu & Liu (57) ABSTRACT

The invention provides an electronic device package and method for manufacturing thereof. The electronic device package includes a substrate, an electronic chip, a bonding pad, a first passivation layer, a conductive layer, a second passivation layer, and a solder ball. The conductive layer has a first side end and a second side end, and the solder ball is positioned on the first side end of the conductive layer. The second passivation layer contacts with both the upper surface and the sidewall of the second side end of the conductive layer, and the first passivation layer contacts with the lower surface of the second side end of the conductive layer, so as to completely encapsulate the second end of the conductive layer. The electronic device package accordingly prevents the moisture penetration and to enhance the reliability of the electronic device.

20 Claims, 10 Drawing Sheets

PACKAGE STRUCTURE AND METHOD FOR MANUFACTURING THEREOF

This application claims priority to U.S. provisional Application Ser. No. 61/751,381, filed Jan. 11, 2013, which is herein incorporated by reference.

BACKGROUND

1. Technical Field

The present disclosure relates to an electronic device package structure, and more particularly, to an electronic component package structure isolating moisture and a method for manufacturing the same.

2. Description of Related Art

In the manufacturing process of electronic components, the electronic components require a packaging operation for use in various applications such as computers, mobiles or digital camera. Therefore, the reliability of the packaging of the electronic components directly affects the performance of electronic devices.

Figure 1A:
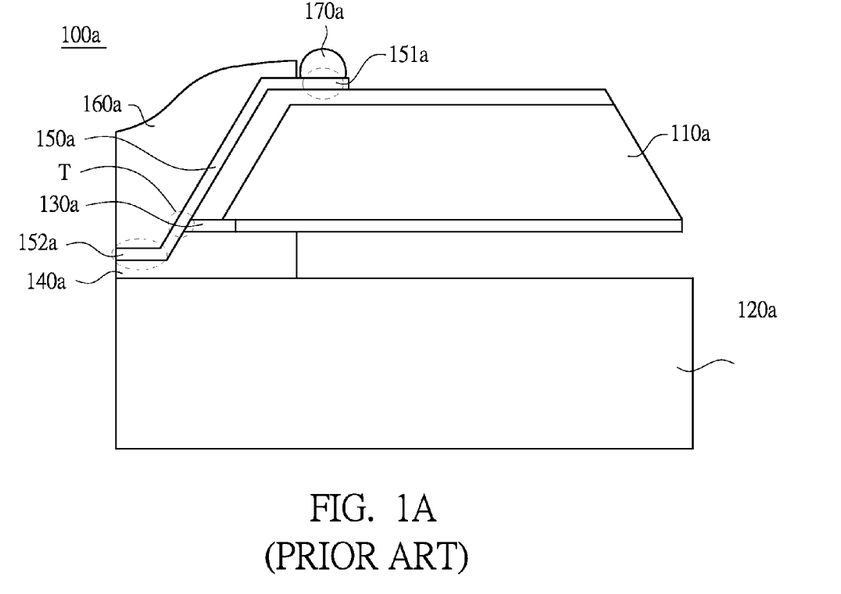

FIG. 1A is a schematic cross-sectional view of a general electronic device package structure 100a. In FIG. 1A, an electronic chip 110a is positioned on a substrate 120a, and electrically connected to a bonding pad 130a. The bonding pad 130a is sandwiched between the electronic chip 110a and the substrate 120a. A first passivation layer 140a is sandwiched between the bonding pad 130a and the substrate 120a. A conductive layer 150a is formed on the electronic chip 110a, and electrically connected to the bonding pad 130a to form a T-contact. In which, the conductive layer 150a has a first side end 151a and a second side end 152a opposite to the first side end 151a, and the bottom surface of the second side end 152a contacts the first passivation layer 140a. Then, a second passivation layer 160a covers the conductive layer 150a. The first side end 151a is exposed, and the second side end 152a is exposed at a sidewall of the general electronic device package structure 100a. A solder ball 170a is formed on the first side end 151a of the conductive layer 150a.

In the general electronic device package structure, the second passivation layer only covers the conductive layer, but the second side end of the conductive layer is exposed at the sidewall of the general electronic device package structure. The moisture from the surrounding may enter into the electronic device package structure along the second side end of the conductive layer, causing the degradation of the T-contact, or even decreasing the performance of the general electronic device. Therefore, there is a need for an improved electronic device package structure and a method for manufacturing thereof to prevent the moisture of the surrounding entering into the improved electronic device package structure, so as to enhance the tolerance and reliability of the improved electronic device.

SUMMARY

For solving the aforementioned issues, one embodiment of the present disclosure is to provide an electronic device package structure isolating moisture. The electronic device package structure includes a substrate, an electronic chip, a bonding pad, a first passivation layer, a conductive layer, a second passivation layer and a solder ball.

The electronic chip is positioned on the substrate. The bonding pad is sandwiched between the substrate and the electronic chip and electrically connected to the electronic chip. The first passivation layer is sandwiched between the substrate and the bonding pad. The conductive layer is positioned on a sidewall of the electronic chip and electrically connected to the bonding pad, and has a first side end and a second side end opposite to the first side end. The bottom surface of the second side end contacts the first passivation layer. The second passivation layer is positioned on the conductive layer. The first side end of the conductive layer is exposed, and the second side end of the conductive layer is covered. The second passivation layer simultaneously contacts the top surface and sidewall of the conductive layer, and completely covers the second side end of the conductive layer with the first passivation layer. The solder ball is positioned on the exposed first side end of the conductive layer.

Another embodiment of the present disclosure is to provide a method for manufacturing an electronic device package structure. The method includes several operations. A semiconductor wafer is provided, and has several electronic chips thereon. A bonding pad is formed under and electrically connected to each of the electronic chips. A first passivation layer is formed under the bonding pad. A conductive layer is formed on a sidewall of each of the electronic chips, and electrically connected to the bonding pad. The conductive layer has a first side end and a second side end. The bottom surface of the second side end of the conductive layer contacts the first passivation layer. The conductive layer is disconnected from a conductive layer on a sidewall of the adjacent electronic chip. A second passivation layer is formed on the conductive layer. The first side end of the conductive layer is exposed, and the second side end of the conductive layer is covered. The second passivation layer simultaneously contacts the top surface and sidewall of the conductive layer, and completely covers the second side end of the conductive layer with the first passivation layer. A solder ball is formed on the first side end of the conductive layer. A disconnection area between the conductive layers of the adjacent electronic chips is diced to separate the electronic chips, so as to provide the electronic device package structure.

In the electronic device package structure, the second passivation layer simultaneously contacts the top surface and sidewall of the conductive layer, and completely covers the second side end of the conductive layer with the first passivation layer. The electronic device package structure may prevent the outside moisture entering into the electronic device package structure and reduce the degradation of the electronic device, so as to enhance the tolerance and reliability of the electronic device.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A is a schematic cross-sectional view of a general electronic device package structure 100a;

DETAILED DESCRIPTION

The embodiments of the transparent conductive structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Figure 1B:
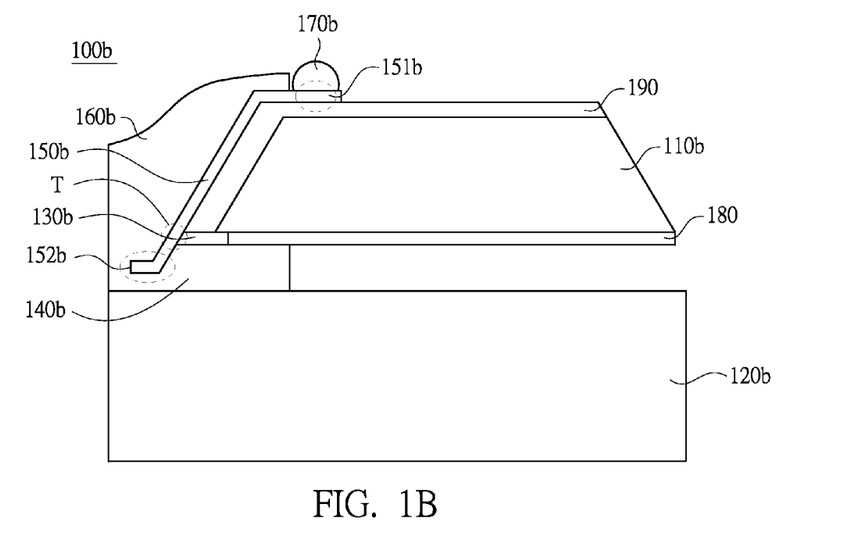
FIG. 1B is a schematic cross-sectional view of an electronic device package structure 100b according to one embodiment of the present disclosure.

FIG. 1B is a schematic cross-sectional view of an electronic device package structure 100b according to one embodiment of the present disclosure. In FIG. 1B, an electronic chip 110b is positioned on a substrate 120b, and electrically connected to a bonding pad 130b. The bonding pad 130b is sandwiched between the electronic chip 110b and the substrate 120b. A first passivation layer 140b is sandwiched between the bonding pad 130b and the substrate 120b. A conductive layer 150b is formed on the electronic chip 110b, and electrically connected to the bonding pad 130b to form a T-contact. In which, the conductive layer 150b has a first side end 151b and a second side end 152b opposite to the first side end 151b, and the bottom surface of the second side end 152b contacts the first passivation layer 140b. Then, a second passivation layer 160b covers the conductive layer 150b. The first side end 151b of the conductive layer 150b is exposed, and the second side end 152b of the conductive layer 150b is covered. A solder ball 170b is formed on the first side end 151b of the conductive layer 150b. In which, the second passivation layer 160b simultaneously contacts the top surface and sidewall of the conductive layer 150b, and completely covers the second side end 152b of the conductive layer 150 with first passivation layer 140b.

According to one embodiment of the present disclosure, the electronic chip 110b includes an integrated circuit device, a photoelectric device, a microelectromechanical (MEM) device, a surface acoustic wave (SAW) device and a combination thereof.

According to one embodiment of the present disclosure, the first passivation layer 140b includes epoxy resin, polyimide (PI) resin, silicon oxide, metal oxide or silicon nitride.

According to one embodiment of the present disclosure, the conductive layer 150b includes copper (Cu), aluminum (Al), nickel (Ni), gold (Au) or a combination thereof.

According to one embodiment of the present disclosure, the second passivation layer 160b includes epoxy resin, polyimide (PI) resin, silicon oxide, metal oxide or silicon nitride.

In FIG. 1B, the electronic device package structure 100b further includes a barrier layer 180 sandwiched between the substrate 120b and the electronic chip 110b. According to one embodiment of the present disclosure, the bonding pad 130b and the barrier layer 180 are on the same surface. According to one embodiment of the present disclosure, the barrier layer 180 includes epoxy resin, polyimide (PI) resin, silicon oxide, metal oxide or silicon nitride.

In FIG. 1B, the electronic device package structure 100b further includes an adhesive layer 190 sandwiched between the conductive layer 150b and the electronic chip 110b. According to one embodiment of the present disclosure, the adhesive layer 190 includes epoxy resin, polyimide (PI) resin, silicon oxide, metal oxide or silicon nitride.

Figure 2A:
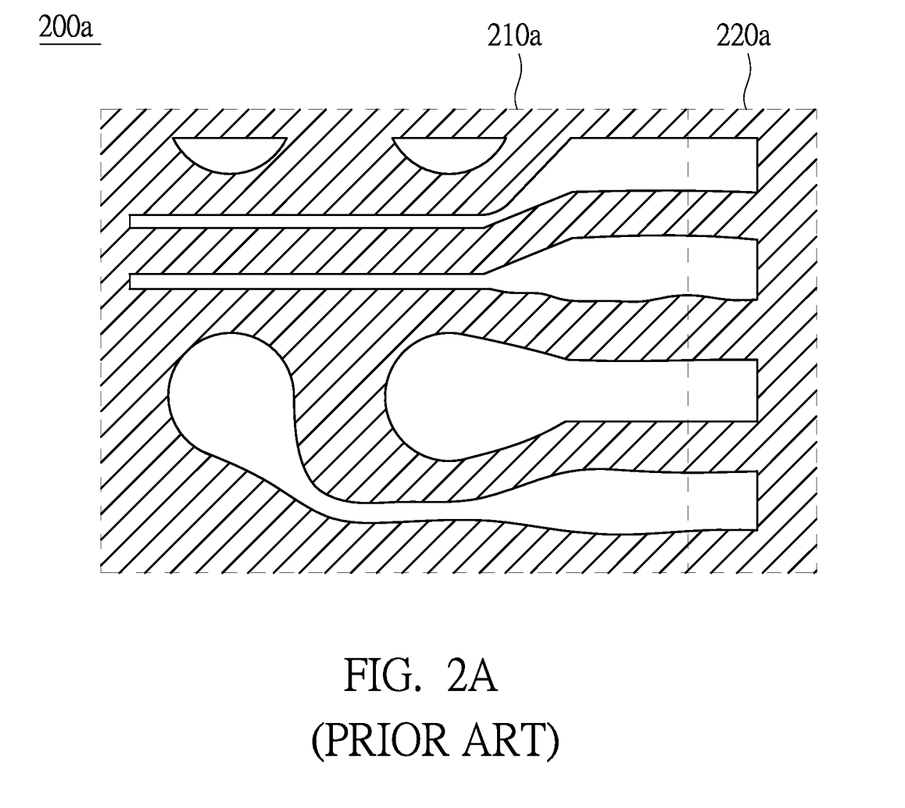
FIG. 2A is a sub-pattern 200a of a general mask for manufacturing a general conductive layer.

FIG. 2A is a sub-pattern 200a of a general mask for manufacturing a general conductive layer. In FIG. 2A, the sub-pattern 200a of the general mask has a plurality of light transmissive areas (white portion) and at least one shading area (oblique portion), and a sub-pattern 210a and a sub-pattern 220a are adjacent sub-patterns. In which, one of the light transmissive areas of the sub-pattern 210a connects one of the light transmissive areas of the sub-pattern 220a.

Figure 2B:
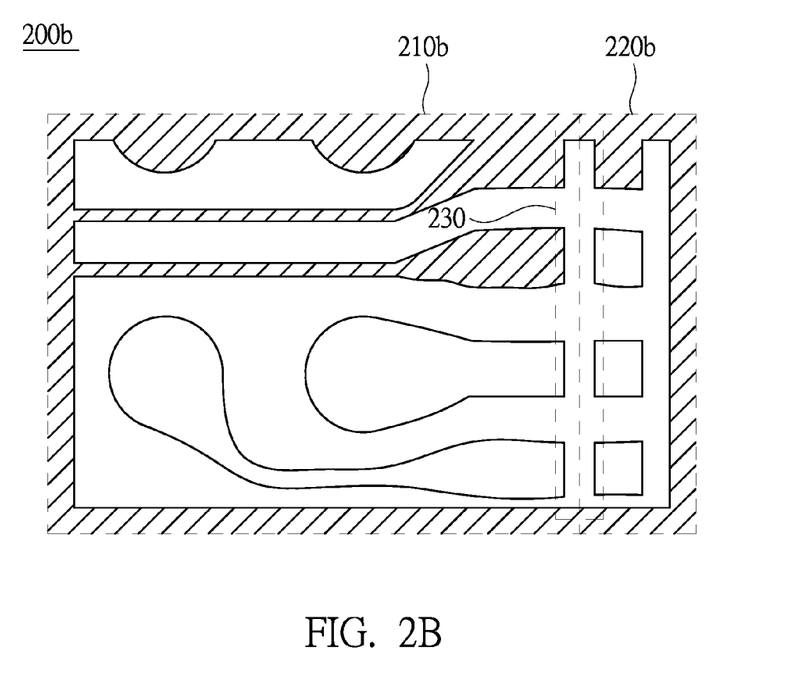
FIG. 2B is a sub-pattern 200b of a mask for manufacturing a conductive layer according to one embodiment of the present disclosure.

FIG. 2B is a sub-pattern 200b of a mask for manufacturing a conductive layer according to one embodiment of the present disclosure. In FIG. 2B, the sub-pattern 200b of the mask has a plurality of light transmissive areas (white portion) and at least one shading area (oblique portion), and a sub-pattern 210b and a sub-pattern 220b are adjacent sub-patterns. In which, the sub-pattern 210b and the sub-pattern 220b have a separating channel 230 therebetween. The separating channel 230 is part of the shading area, so as to separate the light transmissive areas of the sub-pattern 210b and the light transmissive areas of the sub-pattern 220b.

Figure 2C:
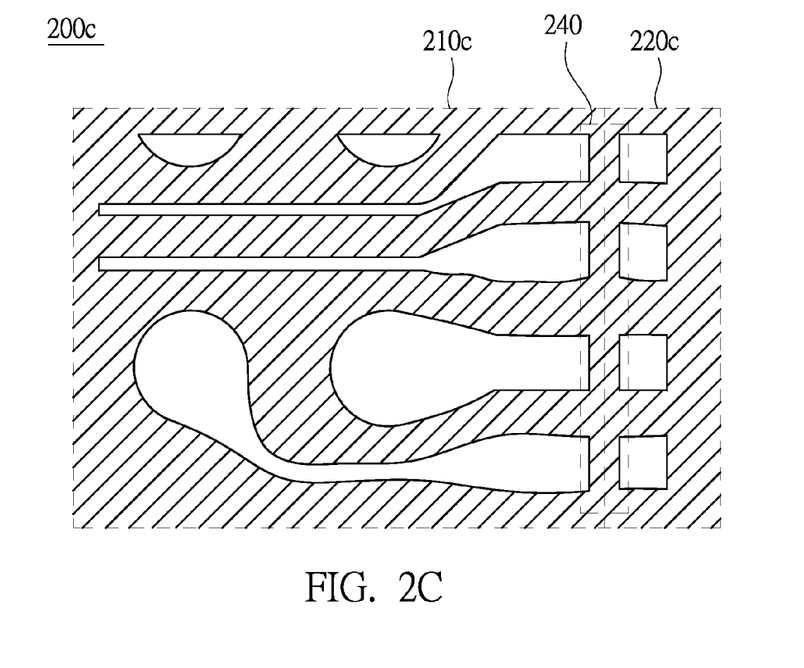
FIG. 2C is a sub-pattern 200c of a mask for manufacturing a conductive layer according to one embodiment of the present disclosure.

FIG. 2C is a sub-pattern 200c of a mask for manufacturing a conductive layer according to one embodiment of the present disclosure. In FIG. 2C, the sub-pattern 200c of the mask has a plurality of shading areas (oblique portion) and at least one light transmissive area (white portion), and a sub-pattern 210c and a sub-pattern 220c are adjacent sub-patterns. In which, the sub-pattern 210c and the sub-pattern 220c have a separating channel 240 therebetween. The separating channel 240 is part of the light transmissive area, so as to separate the shading areas of the sub-pattern 210c and the shading areas of the sub-pattern 220c.

Figure 3A:
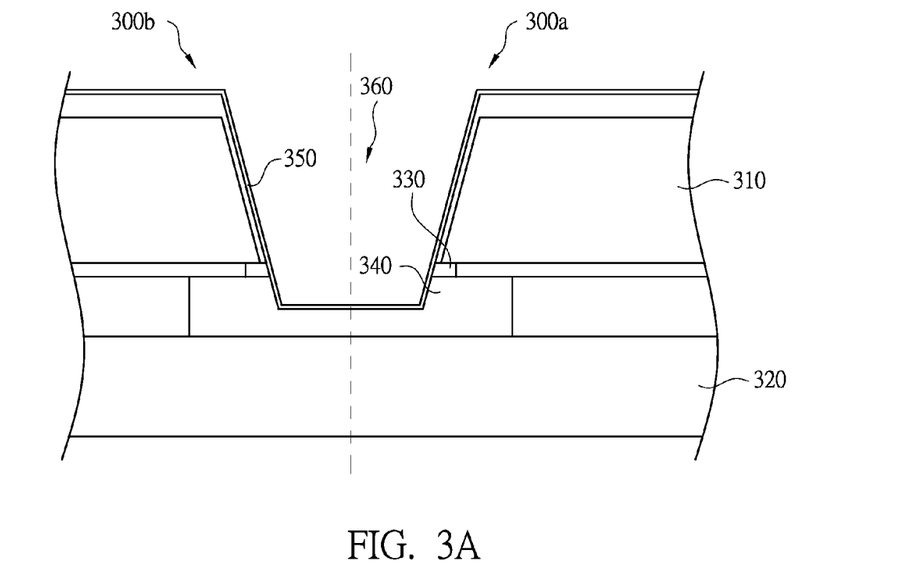
FIGS. 3A-3I are schematic cross-sectional views at various stages of fabricating an electronic device package structure according to one embodiment of the present disclosure.

FIGS. 3A-3I are schematic cross-sectional views at various stages of fabricating an electronic device package structure according to one embodiment of the present disclosure. In FIG. 3A, electronic chips 310 are positioned on a substrate 320, and electrically connected to a bonding pad 330, wherein the bonding pad 330 is sandwiched between the electronic chips 310 and the substrate 320. A first passivation layer 340 is sandwiched between the bonding pad 330 and the substrate 320. A conductive layer 350 is formed on the electronic chip 310, and electrically connected to the bonding pad 330. In which, the bottom surface of the conductive layer 350 contracts the first passivation layer 340. In FIG. 3A, a trench 360 is formed to separate an electronic device package substrate 300a and an adjacent electronic device package substrate 300b.

According to one embodiment of the present disclosure, the method further includes forming a barrier layer sandwiched between the substrate and the electronic chips. According to one embodiment of the present disclosure, the method further includes forming an adhesive layer sandwiched between the electronic chips and the conductive layer.

Figure 3B:
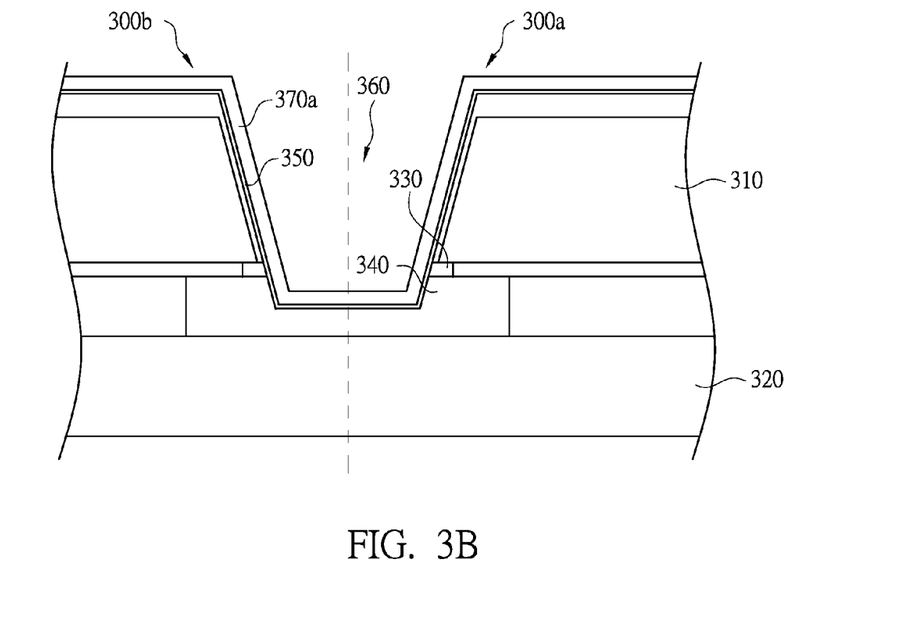
Figure 3C:
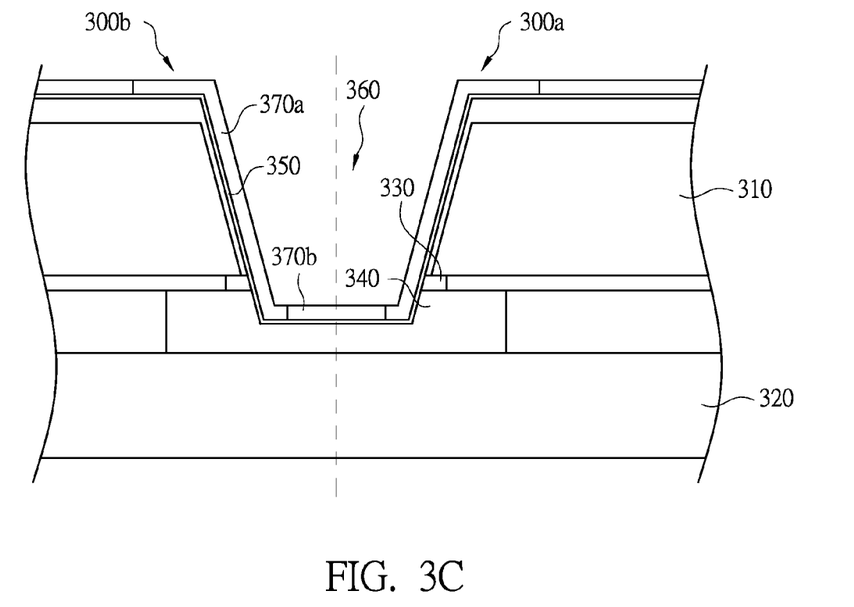

In FIG. 3B, a photo-resist layer 370a is formed on the conductive layer 350. Then, a developing process is performed by applying the mask having the sub-pattern as shown in FIG. 2B or 2C, to form a photo-resist layer 370b having the sub-pattern as the mask, as shown in FIG. 3C. According to one embodiment of the present disclosure, the photo-resist layer 370b is formed by applying a negative photo-resist agent and a clear mask, wherein the clear mask has the sub-pattern as shown in FIG. 2B. According to one embodiment of the present disclosure, the photo-resist layer 370b is formed by applying a positive photo-resist agent and a dark mask, wherein the dark mask has the sub-pattern as shown in FIG. 2C.

Figure 3D:
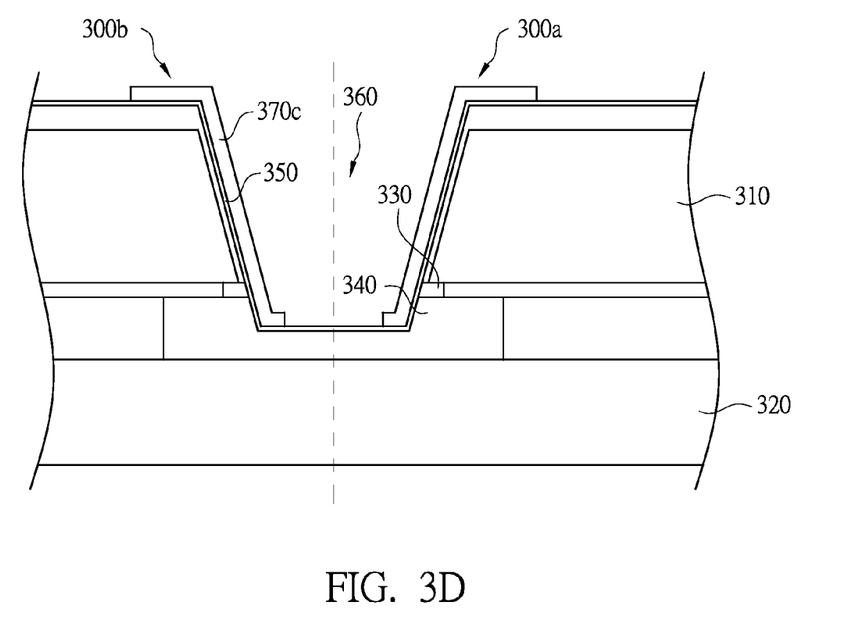

In FIG. 3D, a photo-resist layer 370b is removed to form a photo-resist layer 370c having a recess in the trench 360, so that part of the conductive layer 350 is exposed. It is noted that, the recess of the photo-resist layer 370c is corresponded to the separating channel 230 or 240 of the sub-pattern of the mask as shown in FIG. 2B or 2C.

Figure 3E:
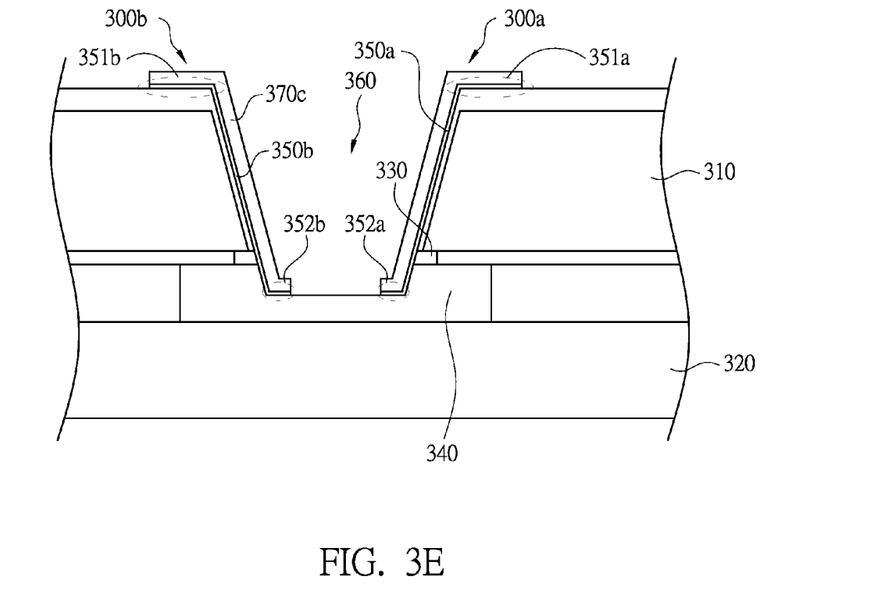

In FIG. 3E, the exposed conductive layer 350 is etched, so as to expose part of the first passivation layer 340 in the trench 360 to form conductive layers 350a and 360b. In which, the conductive layer 350a has a first side end 351a and a second side end 352a, and the conductive layer 350b has a first side end 351b and a second side end 352b. The second side end 352a of the conductive layer 350a is disconnected from the second side end 352b of the conductive layer 350b. However, in general methods, there is no an etching process of a conductive layer, so that the conductive layer of the general electronic device package structure is connected to a conductive layer of the adjacent electronic device package structure.

Figure 3F:
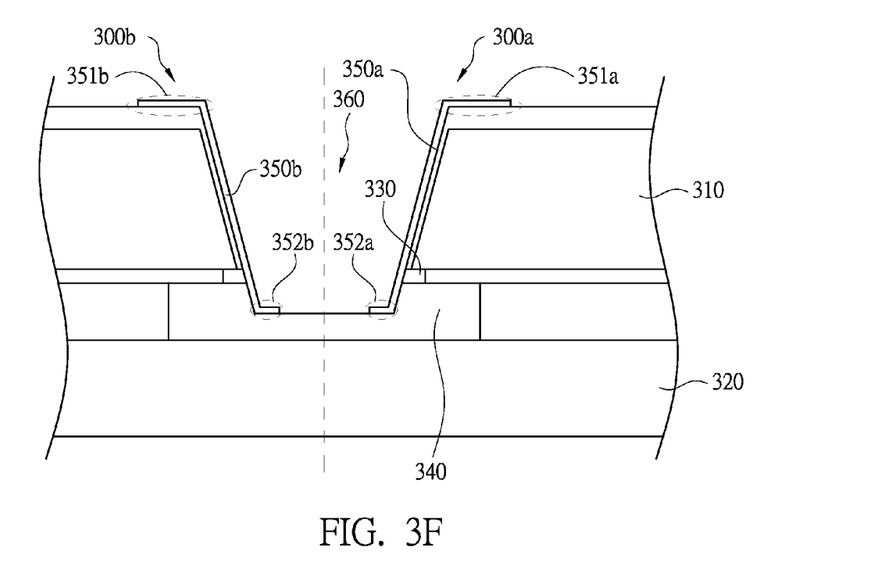
Figure 3G:
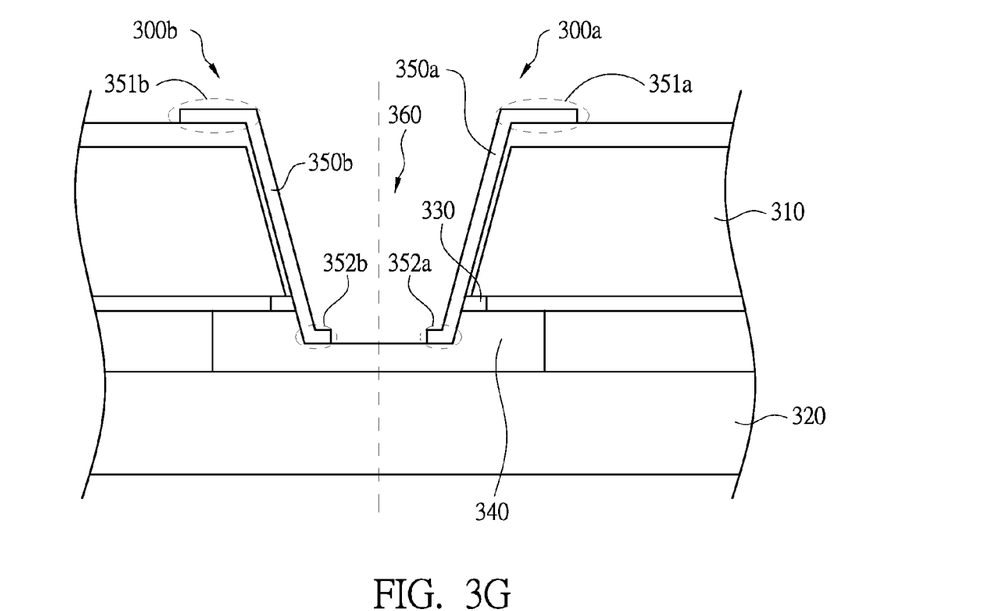

In FIG. 3F, after the photo-resist layer 370c (see FIG. 3E) is removed, the conductive layers 350a and 350b are exposed. Then, metal is deposited on the conductive layers 350a and 350b to thicken the conductive layers 350a and 350b, as shown in FIG. 3G.

Figure 3H:
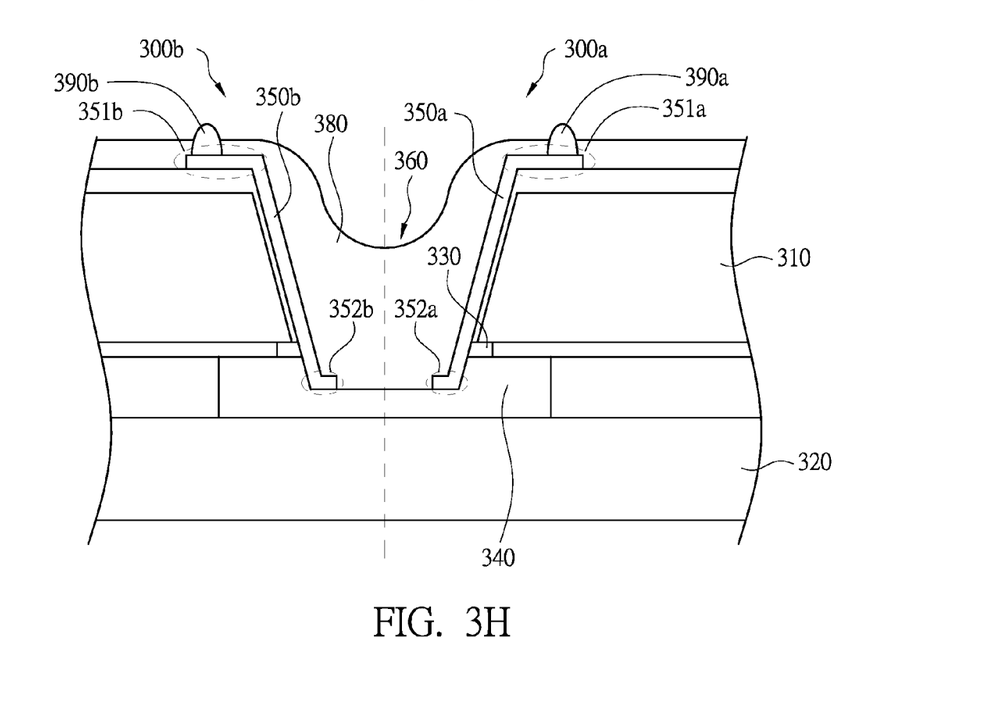
Figure 3I:
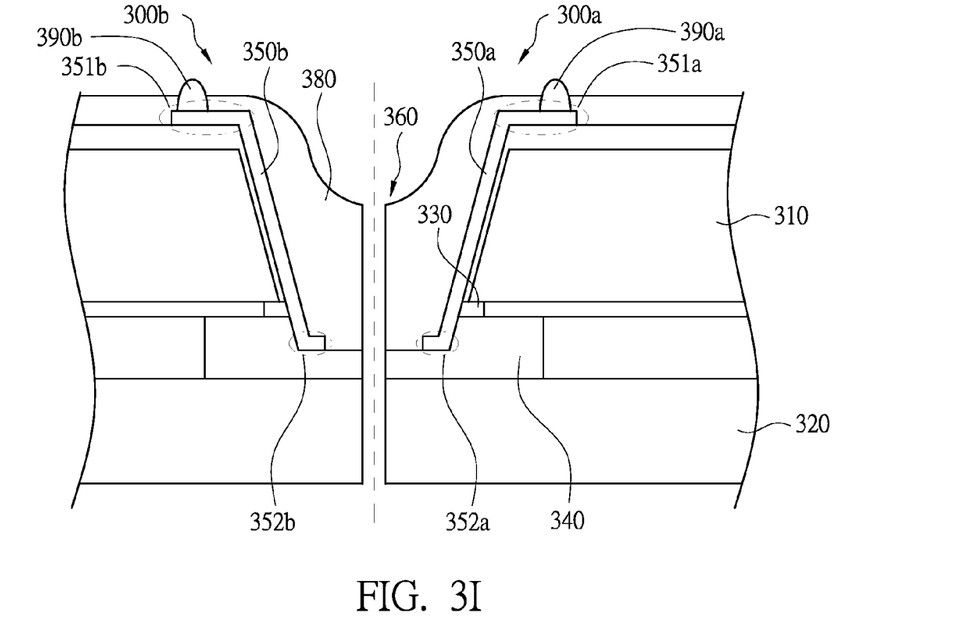

In FIG. 3H, a second passivation layer 380 is formed on the conductive layers 350a and 350b. First side ends 351a and 351b of the conductive layers 350a and 350b are exposed, and second side ends 352a and 352b of the conductive layers 350a and 350b are covered. In which, the second passivation layer 380 simultaneously contacts top surfaces and sidewalls of the conductive layers 350a and 350b, and completely covers the second side ends 352a and 352b of the conductive layers 350a and 350b with the first passivation layer 340. Then, a solder ball 390a is formed on the first side end 351a of the conductive layer 350a, and a solder ball 390b is formed on the first side end 351b of the conductive layer 350b. By dicing along the trench 360, individual electronic device package structure 300a and 300b are provided, as shown in FIG. 3I.

Figure 4A:
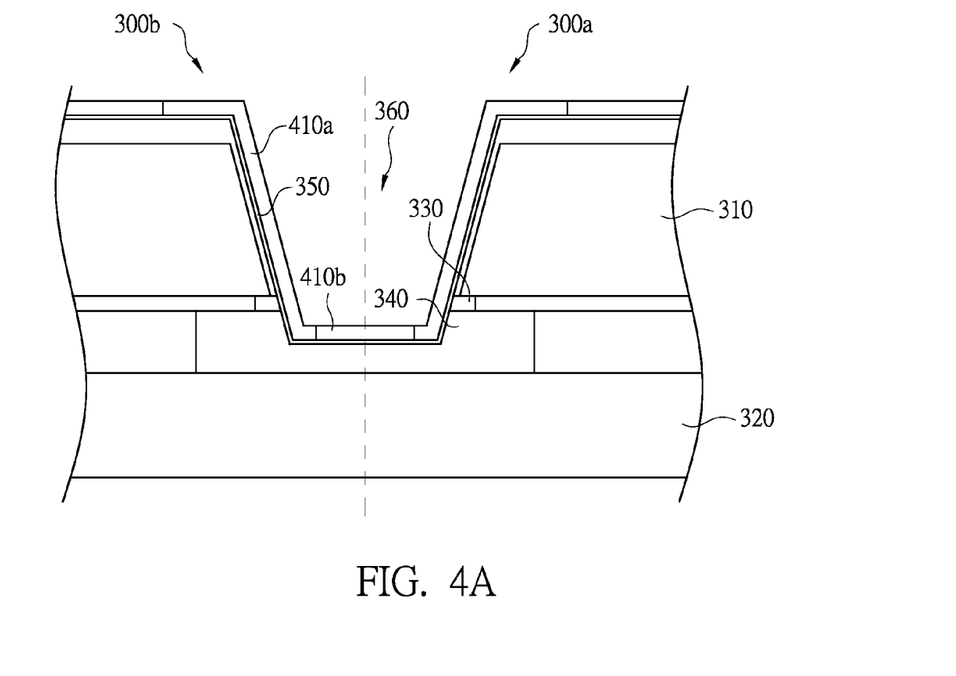
FIGS. 4A-4E are schematic cross-sectional views at various stages of fabricating an electronic device package structure according to one embodiment of the present disclosure.

FIGS. 4A-4E are schematic cross-sectional views at various stages of fabricating an electronic device package structure according to one embodiment of the present disclosure. In FIG. 4A, followed the structure as shown in FIG. 3B, a developing process is performed by applying the mask having the sub-pattern as shown in FIG. 2B or 2C, to form a photo-resist layer 410a having the sub-pattern as the mask. According to one embodiment of the present disclosure, the photo-resist layer 410a is formed by applying a positive photo-resist agent and a clear mask, wherein the clear mask has the sub-pattern as shown in FIG. 2B. According to one embodiment of the present disclosure, the photo-resist layer 410a is formed by applying a negative photo-resist agent and a dark mask, wherein the dark mask has the sub-pattern as shown in FIG. 2C.

Figure 4B:
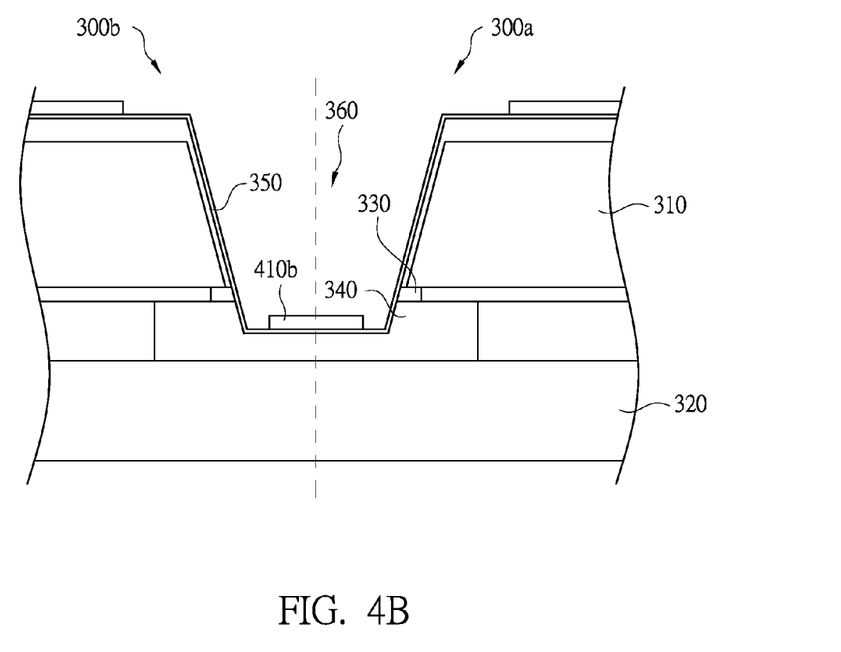

In FIG. 4B, a photo-resist layer 410a (see FIG. 4A) is removed to form a photo-resist layer 410b having an embossment in the trench 360, so that part of the conductive layer 350 is exposed. It is noted that, the embossment of the photo-resist layer 410b is corresponded to the separating channel 230 or 240 of the sub-pattern of the mask as shown in FIG. 2B or 2C.

Figure 4C:
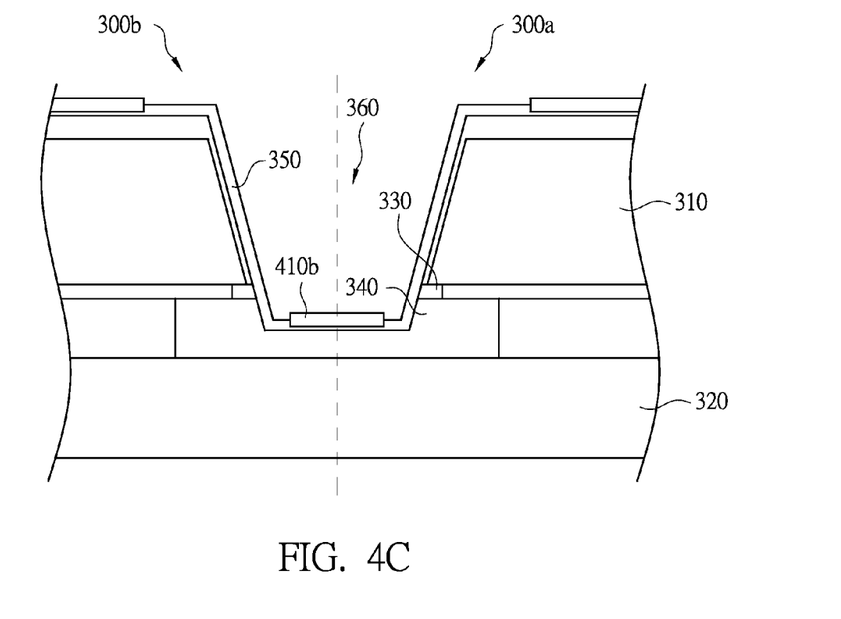
Figure 4D:
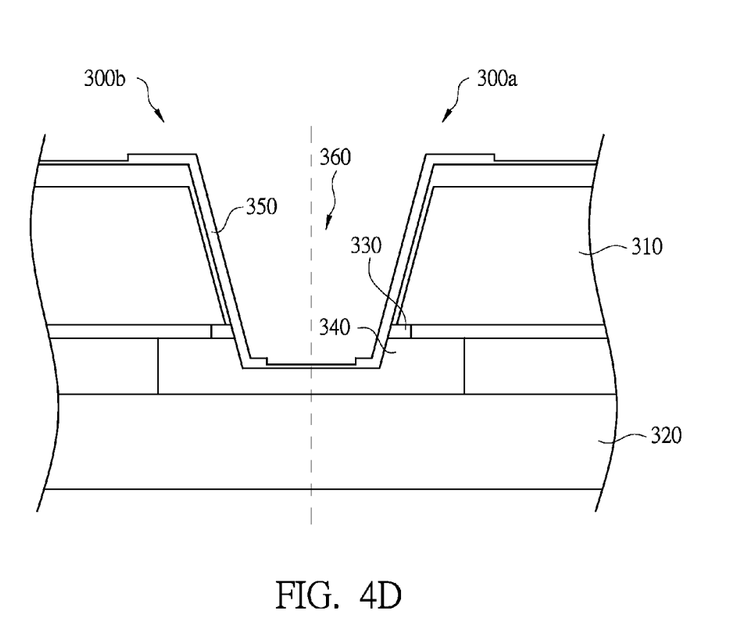

In FIG. 4C, metal is deposited on the exposed conductive layers 350 to thicken the conductive layers 350. Then, the photo-resist layer 410b is removed to form the conductive layers 350 having a recess, as shown in FIG. 4D.

Figure 4E:
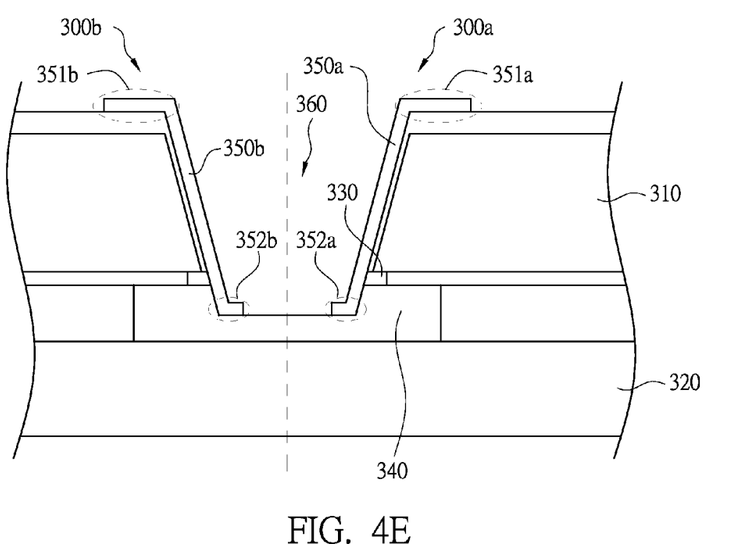

In FIG. 4E, the recess of the conductive layer 350 is etched to expose part of the first passivation layer 340 in the trench 360, so as to form the conductive layers 350a and 360b. In which, the conductive layer 350a has a first side end 351a and a second side end 352a, and the conductive layer 350b has a first side end 351b and a second side end 352b. The second side end 352a of the conductive layer 350a is disconnected from the second side end 352b of the conductive layer 350b.

Then, as shown in FIGS. 3H-3I, the second passivation layer 380, the solder balls 390a and 390b, and the dicing process along the trench 360 are sequentially formed, so as to separate into the individual electronic device package structure 300a and 300b.

It is noted that, the first passivation layer contacts the bottom surface of the second side end of the conductive layer, and the second passivation layer simultaneously contacts the top surface and sidewall of the conductive layer, so that the first passivation layer and the second passivation layer completely covers the second side end of the conductive layer to prevent moisture entering into the electronic device package structure. Because the degradation of the electronic device is reduced, the reliability of the electronic device may be enhanced.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. An electronic device package structure, comprising:
a substrate;
an electronic chip positioned on the substrate;
a boding pad sandwiched between the substrate and the electronic chip, and electrically connected to the electronic chip;
a first passivation layer sandwiched between the substrate and the bonding pad;
a conductive layer positioned on a sidewall of the electronic chip and electrically connected to the bonding pad, the conductive layer comprising a first side end and a second side end opposite to the first side end, wherein the bottom surface of the second side end contacts the first passivation layer;
a second passivation layer positioned on the conductive layer, exposing the first side end of the conductive layer and covering the second side end of the conductive layer, wherein the second passivation layer simultaneously contacts the top surface and a sidewall of the conductive layer, and completely covers the second side end of the conductive layer with the first passivation layer; and
a solder ball positioned on the exposed first side end of the conductive layer.

2. The electronic device package structure of claim 1, wherein the electronic chip comprises an integrated circuit device, a photoelectric device, a microelectromechanical (MEM) device, a surface acoustic wave (SAW) device or a combination thereof.

3. The electronic device package structure of claim 1, wherein the first passivation layer comprises epoxy resin, polyimide (PI) resin, silicon oxide, metal oxide or silicon nitride.

4. The electronic device package structure of claim 1, wherein the conductive layer comprises copper (Cu), aluminum (Al), nickel (Ni), gold (Au) or a combination thereof.

5. The electronic device package structure of claim 1, wherein the second passivation layer comprises epoxy resin, polyimide (PI) resin, silicon oxide, metal oxide or silicon nitride.

6. The electronic device package structure of claim 1, further comprising a barrier layer sandwiched between the substrate and the electronic chip.

7. The electronic device package structure of claim 6, wherein the bonding pad and the barrier layer are on the same surface.

8. The electronic device package structure of claim 6, wherein the barrier layer comprises epoxy resin, polyimide (PI) resin, silicon oxide, metal oxide or silicon nitride.

9. The electronic device package structure of claim 1, further comprising an adhesive layer sandwiched between the conductive layer and the electronic chip.

10. The electronic device package structure of claim 9, wherein the adhesive layer comprises epoxy resin, polyimide (PI) resin, silicon oxide, metal oxide or silicon nitride.

11. A method for manufacturing an electronic device package structure, comprising:
   providing a semiconductor wafer including a plurality of electronic chips;
   forming a bonding pad under each of the electronic chips and electrically connected to each of the electronic chips;
   forming a first passivation layer under the bonding pad;
   forming a conductive layer on a sidewall of each of the electronic chips and electrically connected to the bonding pad, wherein the conductive layer comprises a first side end and a second side end, wherein the bottom surface of the second side end of the conductive layer contacts the first passivation layer, and the respective conductive layers on the sidewalls of the adjacent electronic chips are not connected to each other;
   forming a second passivation layer on the conductive layer, exposing the first side end of the conductive layer and covering the second side end of the conductive layer, wherein the second passivation layer simultaneously contacts the top surface and a sidewall of the conductive layer, and completely covers the second side end of the conductive layer with the first passivation layer;
   forming a solder ball on the first side end of the conductive layer; and
   dicing a disconnection area of the conductive layers between the adjacent electronic chips to separate the electronic chips.

12. The method of claim 11, further comprising:
   providing a substrate; and
   forming a barrier layer sandwiched between the substrate and each of the electronic chips.

13. The method of claim 11, further comprising forming an adhesive layer sandwiched between each of the electronic chips and the conductive layer.

14. The method of claim 11, wherein forming the conductive layer comprises:
   forming a conductive layer on the sidewall of each of the electronic chips and electrically connected to the bonding pad;
   forming a photo-resist layer on the conductive layer;
   etching part of the conductive layer, so that the conductive layer is disconnected from a conductive layer of an adjacent electronic device package structure;
   removing the photo-resist layer; and
   depositing a metal on the conductive layer to thicken the conductive layer.

15. The method of claim 14, wherein forming the photo-resist layer comprises:
   coating a photo-resist agent on the conductive layer to form a photo-resist layer;
   applying a mask to form one of a plurality of sub-patterns on the photo-resist layer; and
   removing part of the photo-resist layer to expose part of the conductive layer,
   wherein the sub-patterns are individually corresponded to the electronic chips, and each of the sub-patterns and the adjacent one of the sub-patterns have a separating channel therebetween; after part of the photo-resist layer is removed, the photo-resist layer corresponded to the separated channel forms a recess, so as to disconnect the conductive layer from the conductive layer of the adjacent electronic device package structure.

16. The method of claim 15, wherein the photo-resist agent is a positive photo-resist agent, and the mask is a dark mask.

17. The method of claim 15, wherein the photo-resist agent is a negative photo-resist agent, and the mask is a clear mask.

18. The method of claim 11, wherein forming the conductive layer comprises:
   forming a conductive layer on the sidewall of each of the electronic chips and electrically connected to the bonding pad;
   forming a photo-resist layer on the conductive layer;
   depositing metal on the conductive layer to thicken the conductive layer;
   removing the photo-resist layer; and
   etching part of the conductive layer, so that the conductive layer is disconnected from a conductive layer of an adjacent electronic device package structure.

19. The method of claim 18, wherein forming the photo-resist layer comprises:
   coating a photo-resist agent on the conductive layer to form a photo-resist layer;
   applying a mask to form one of a plurality of sub-patterns on the photo-resist layer; and
   removing part of the photo-resist layer to expose part of the conductive layer,
   wherein the sub-patterns are individually corresponded to the electronic chips, and each of the sub-patterns and the adjacent one of the sub-patterns have a separating channel therebetween; after part of the photo-resist layer is removed, the photo-resist layer corresponded to the separated channel forms a embossment, so as to disconnect the conductive layer from the conductive layer of the adjacent electronic device package structure.

20. The method of claim 19, wherein the photo-resist agent is a positive or negative photo-resist agent, and the mask is a clear or dark mask.

* * * * *